(12) United States Patent
Jeong et al.

(10) Patent No.: US 6,319,828 B1
(45) Date of Patent: Nov. 20, 2001

(54) METHOD FOR MANUFACTURING A CHIP SCALE PACKAGE HAVING COPPER TRACES SELECTIVELY PLATED WITH GOLD

(75) Inventors: Do Soo Jeong; Hai Jeong Sohn, both of Kyungki-do; Dong Ho Lee, Seoul, all of (KR)

(73) Assignee: SamSung Electronics Co., Ltd. (KR)

( * ) Notice: Subject to any disclaimer, the term of this patent is extended or adjusted under 35 U.S.C. 154(b) by 0 days.

(21) Appl. No.: 09/317,537

(22) Filed: May 24, 1999

(30) Foreign Application Priority Data

Jun. 24, 1998 (KR) .................................................. 98-23888

(51) Int. Cl.$^7$ .................................................. H01L 21/44
(52) U.S. Cl. .......................... 438/674; 438/677; 438/106; 438/612; 438/611
(58) Field of Search .................................... 438/614, 597, 438/106, 611, 612, 118, 125, 126, 674, 677; 257/735

(56) References Cited

U.S. PATENT DOCUMENTS 4,682,270 * 7/1987 Whitehead et al. .................. 361/764
4,988,395 * 1/1991 Taguchi et al. .......................... 148/23
6,114,753 * 9/2000 Nagai et al. .......................... 257/668

\* cited by examiner

Primary Examiner—Carl Whitehead, Jr.
Assistant Examiner—Christy Novacek
(74) Attorney, Agent, or Firm—Skjerven Morrill MacPherson LLP

(57) ABSTRACT

A method for manufacturing a chip scale package comprises preparing a tape wiring board that includes a polyimide tape having top and bottom surfaces, Cu traces formed on the bottom surface of the tape, a window formed in the tape to enable the Cu traces to be connected to a semiconductor chip attached below the board, multiple connection holes formed in the tape to expose portions of the Cu traces therethrough and define solder ball mounting pads, and an elastomer chip carrier attached to the bottom surface of the tape. The method includes applying either a pre-flux or a cover sheet over the solder ball mounting pads. The pre-flux and the cover sheet each prevents the solder ball mounting pads being plated with gold. This, in turn, prevents the formation of intermetallic compounds in the solder balls so that the bond strength between the solder balls and a pad to which they attach is improved.

14 Claims, 9 Drawing Sheets

METHOD FOR MANUFACTURING A CHIP SCALE PACKAGE HAVING COPPER TRACES SELECTIVELY PLATED WITH GOLD

BACKGROUND

1. Field of the Invention

The present invention generally relates to a method for manufacturing semiconductor packages, and more particularly, for manufacturing a chip scale package ("CSP").

2. Description of the Related Art

Electronic industry trends, such as miniaturization and multifunctionalization of electronic devices, have resulted in a relatively new semiconductor package called a Ball Grid Array ("BGA") package. When compared to conventional plastic packages, the BGA package has a higher surface-mounting density and superior electrical capabilities. In some respects, however, the BGA package is not as reliable as some conventional packages. Unlike a conventional plastic package that uses moisture-resistant lead frames, the BGA package uses a printed circuit board that is more moisture-prone. Another disadvantage of the BGA package is that space must be reserved on the board for mounting the semiconductor chip. In view of the foregoing drawbacks, a Chip Scale Package ("CSP") has been proposed.

Many companies in the United States, Japan and Korea have developed or manufactured various types of CSPs. One such type of CSP is called the Fine Pitch BGA ("FPBGA") package. The $\mu$-BGA package, developed by Tessera in the U.S., is an example of a FPBGA package. The FPBGA packages employ a thin and flexible circuit board, such as a tape wiring board. The flexible circuit board includes beam leads that connect to bonding pads of a semiconductor chip through windows formed in the board.

FIG. 1 is a cross-sectional view of a conventional $\mu$-BGA package 200. Referring to FIG. 1, a tape wiring board 120 includes a polyimide tape 124 having top and bottom surfaces. Copper (Cu) traces 130 are formed on the bottom surface of the polyimide tape 124. Beam leads 160 extend from the Cu traces 130. An elastomer layer 150 is interposed between the wiring board 120 and a semiconductor chip 110. Beam leads 160, bonded to bonding pads 112 on the semiconductor chip 110, electrically connect bonding pads 112 to respective solder bumps 168 via the Cu traces 130 and the solder ball mounting pads 136.

The solder ball mounting pads 136 are portions of the Cu traces 130 that are exposed through connection holes 123. An encapsulant 189 encapsulates the bonding area between the bonding pads 112 and the beam leads 160 to protect the area from external environmental stresses. The beam leads 160 also comprise portions of the Cu traces 138 that bond to the bonding pads 112 on the semiconductor chip 110. The beam leads 160 are plated with gold (Au) to improve the bonding quality between the beam leads 160 and the bonding pads 112. Another Au layer 164 is plated on the solder ball mounting pads 136, and the solder balls 168 are attached to the Au layer 164 on the solder ball mounting pads 136. The solder balls 168 are typically a 63% tin (Sn)-37% lead (Pb) alloy.

FIG. 2 depicts the $\mu$-BGA package 200 of FIG. 1 mounted on a main board 170. The solder bumps 168 of the package 200 are soldered to pads 172 on the board 170, typically, in an infrared reflow soldering process in which the soldering process occurs at a maximum temperature of about 220 to 230° C. During the soldering process, Au atoms from the Au layer 164 diffuse into the solder balls and form an intermetallic compound 168a with the Sn and Pb atoms of the solder balls. The intermetallic compound 168a migrates to the outer surface of the solder bumps 168 and deteriorates the solderability between the solder bumps 168 and the pads 172 on the main board 170. It would be desirable if the formation of this undesirable intermetallic compound 168a could be eliminated.

SUMMARY OF THE INVENTION

In accordance with a first embodiment of the present invention, a method for manufacturing a chip scale package includes: (A) preparing a tape wiring board that comprises a strip of polyimide tape having top and bottom surfaces, Cu traces formed on the bottom surface of the polyimide tape, a window formed in the polyimide tape to enable Cu traces extending across the window to be connected to a semiconductor chip through the window, multiple connection holes formed in the polyimide tape to expose portions the of Cu traces for solder ball attachment, and an elastomer chip carrier attached to the bottom surface of the tape inside of the window; (B) applying a "pre-flux" solution to the portions of the Cu traces exposed through the connection holes to prevent them from being plated with Au; (C) defining beam leads by Au-plating portions of the Cu traces extending across the window; (D) attaching a semiconductor chip to the bottom surface of the elastomer chip carrier such that a peripheral portion of the chip overhangs the carrier and is exposed below the window; (E) bonding the beam leads to the semiconductor chip through the window; (F) encapsulating the bonding area between the beam leads and the semiconductor chip; and, (G) attaching solder balls to the respective portions of the Cu traces exposed through the connection holes.

In steps (B)–(F), the pre-flux used should be thermally stable so that it does not deteriorate prior to effecting solder ball attachment step (G). The step (G) comprises: (G1) placing solder balls on the pre-flux on the Cu traces exposed through the connection holes; (G2) attaching the solder balls to the Cu traces exposed through the connection holes by a reflow soldering process; and; (G3) washing off any remaining pre-flux and other impurity residues around the solder balls.

A second embodiment of the present invention also provides a method for manufacturing a chip scale package. The second method comprises: (A') preparing a tape wiring board that includes a strip of polyimide tape having top and bottom surfaces, Cu traces formed on the bottom surface of the polyimide tape, a window formed in the polyimide tape to enable Cu traces extending across the window to be connected to a semiconductor chip through the window, multiple connection holes formed in the polyimide tape to expose portions the Cu traces for solder ball attachment, and an elastomer chip carrier attached to the bottom surface of the polyimide tape inside of the window; (B') attaching a cover film to the top surface of the polyimide tape to prevent the Cu traces exposed through the connection holes from being plated with Au; (C') Au-plating portions of the Cu traces that are exposed through the window to define beam leads; (D') removing the cover film from the polyimide tape; (E') attaching a semiconductor chip to the elastomer; (F') bonding the beam leads to the semiconductor chip though the window; (G') encapsulating the bonding area between the beam leads and the semiconductor chip; and, (H') attaching solder balls to the respective portions of the Cu traces exposed through the connection holes.

In step (B'), the cover film has a window in it corresponding to the window in the polyimide tape to enable the Cu traces extending across the window to be plated with Au to define beam leads. The cover film is preferably an ultraviolet sensitive tape that is made removable by irradiating it with an ultraviolet light. Step (H') comprises: (H1') applying a flux to the Cu traces exposed through the connection holes; (H2') placing solder balls on the flux on the Cu traces exposed through the connection holes; (H3') attaching solder balls to respective ones of the Cu traces exposed through the connection holes by a reflow soldering process; and, (H4') washing off any remaining flux and other impurity residues around the solder balls.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Figure 3:
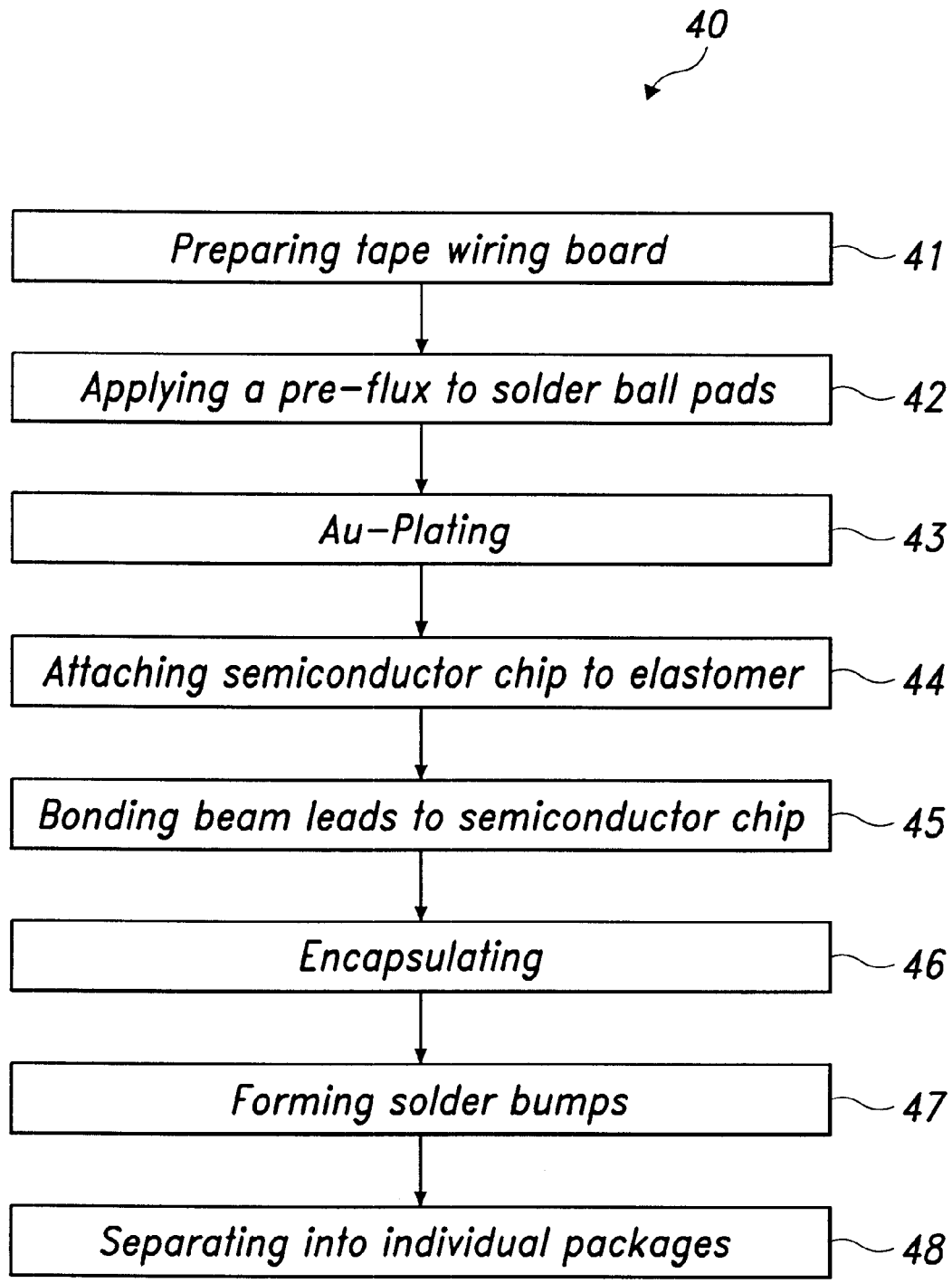
FIG. 3 is a flowchart of a method for manufacturing a chip scale package according to a first embodiment of the present invention.
Figure 4:
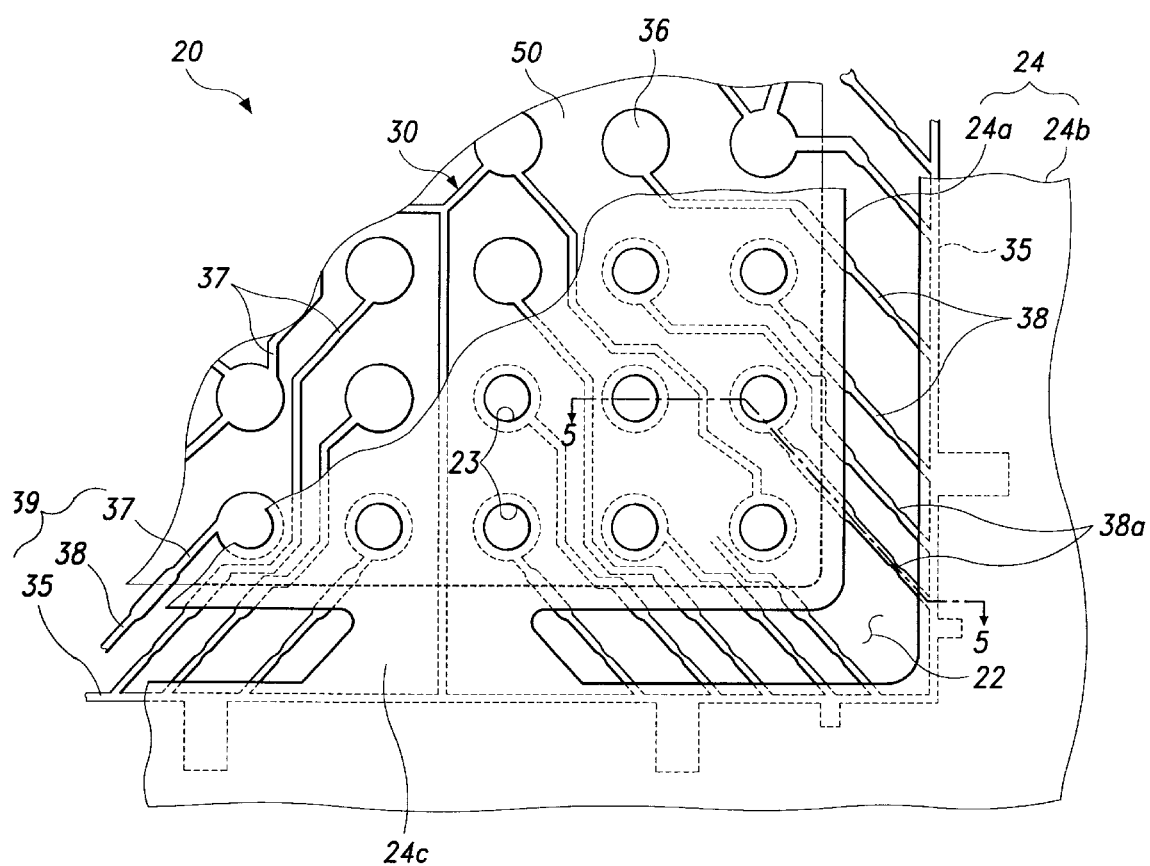
FIG. 4 is an exploded plan view of a tape wiring board.
Figure 5:
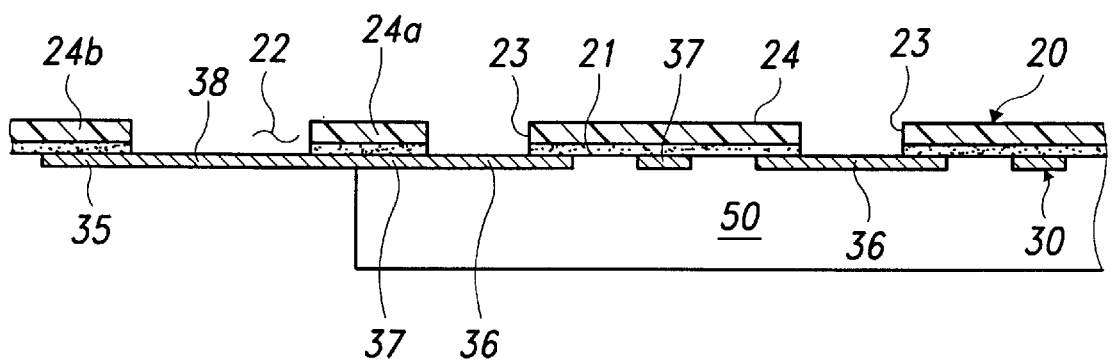
FIG. 5 is a cross-sectional view taken along the line 5—5 of FIG. 4.

With reference to FIGS. 3 to 12, a method 40 for manufacturing a chip scale package according to a first embodiment of the present invention comprises the following:

As shown schematically in FIG. 3, the first method 40 starts with preparing a tape wiring board 20 having an elastomer chip carrier 50 attached to its bottom surface (step 41). As shown in FIGS. 4 and 5, the wiring board 20 is manufactured by attaching a thin copper film to the bottom surface of a strip of polyimide tape 24 with an adhesive 21 and patterning the copper film by using a photolithography method. The wiring board 20 includes a polyimide tape 24, and Cu traces 30 that are formed by the photolithography of the copper film. Typically, the wiring board strip includes a plurality of identical wiring boards 20 connected to each other in a matrix, or "ganged," form for economy of manufacture.

The polyimide tape 24 includes an inner portion 24a that has a plurality of connection holes 23 formed through the thickness of the tape, a window 22 that is discontinuously formed around a perimeter of the inner portion 24a, and an outer portion 24b that is disposed outside the perimeter of the window 22. Support tabs 24c extend across the window 22 to connect the inner portion 24a to the outer portion 24b. The connection holes 23 define solder ball pads 36, to which solder balls are to be attached, by exposing portions of the Cu traces 30.

The Cu traces 30 include the solder ball pads 36 formed on the bottom surface of the inner portion 24a, as well as wiring patterns 39 which extend outwardly from the solder ball pads 36. The wiring patterns 39 include inner wiring patterns 37 connected to the solder ball pads 36 and disposed on the bottom surface of the inner part 24a, outer wiring patterns 38 that extend from the inner wiring patterns 37 across the window 22 to the outer portion 24b, and support wiring patterns 35 that extend from the outer wiring patterns 38 and are disposed on the bottom surface of the outer portion 24b.

Each of the outer wiring patterns 38 has a pair of opposing notches 38a formed in it that act as stress raisers so that the outer wiring patterns 38 will cut or tear easily during the beam lead bonding process described below. The outer portion 24b of the polyimide tape 24 serves as a frame for supporting the inner portion 24a. The outer wiring patterns 38 are about 20 μm thick and ultimately become beam leads that are bonded to bonding pads on a semiconductor chip, as described below.

The elastomer chip carrier 50 is a buffer that is formed by screen printing an elastomeric material on the bottom surface of the inner portion 24a, or alternatively, by attaching a sheet of cured elastomer to the bottom surface of the inner portion 24a with, e.g., an adhesive.

Ordinarily, the next step would involve Au plating of selected portions of the tape wiring board 20. However, this embodiment of the present invention departs from the conventional method in that, prior to plating, a "pre-flux" material is applied to the solder ball pads 36.

Figure 6:
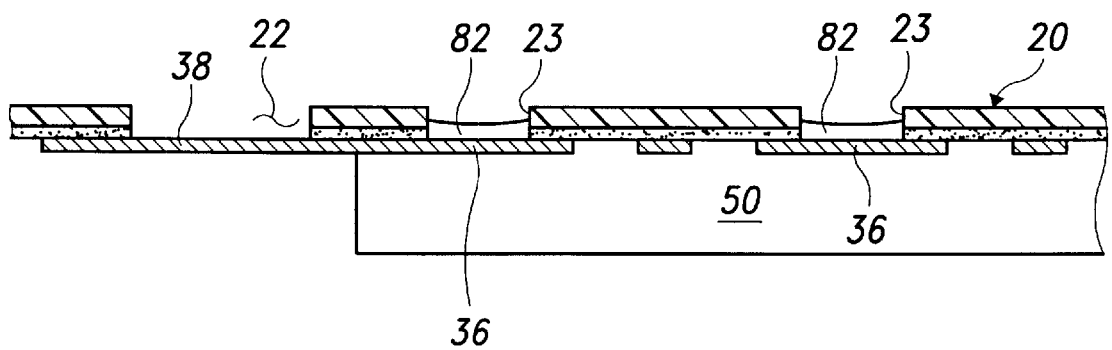
FIG. 6 is a cross-sectional view depicting a pre-flux applied to portions of the Cu traces exposed through connection holes in the wiring board.

Referring to FIG. 6, the pre-flux 82 material is applied to each of the solder ball pads 36 by a screen printing method to prevent the solder pads 36 both from being oxidized and from being plated with Au (FIG. 3, step 42) during a subsequent plating process. The pre-flux 82 is an organic material that can retain its original form and properties at high temperature.

Figure 7:
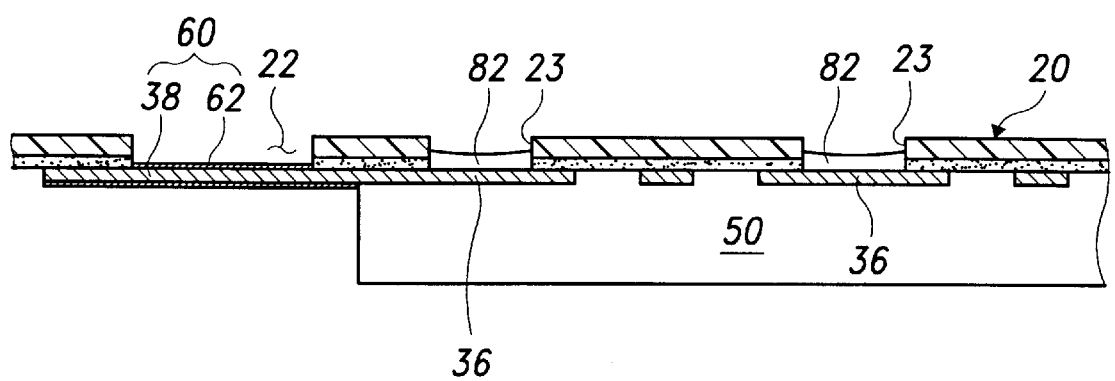
FIG. 7 is a cross-sectional view depicting Au-plated beam leads of the wiring board.

Referring to FIG. 7, the plating step results in Au layers 62 about 1 μm thick being deposited on the outer wiring patterns 38 that, in turn, define beam leads 60 (step 43) for attachment to a semiconductor chip. The pre-flux 82 on the solder ball pads 36 prevents the pads from being plated with Au layers 62. Thereby, a gold-plated portion and a non gold-plated portion of the copper traces 30 are formed.

Figure 8:
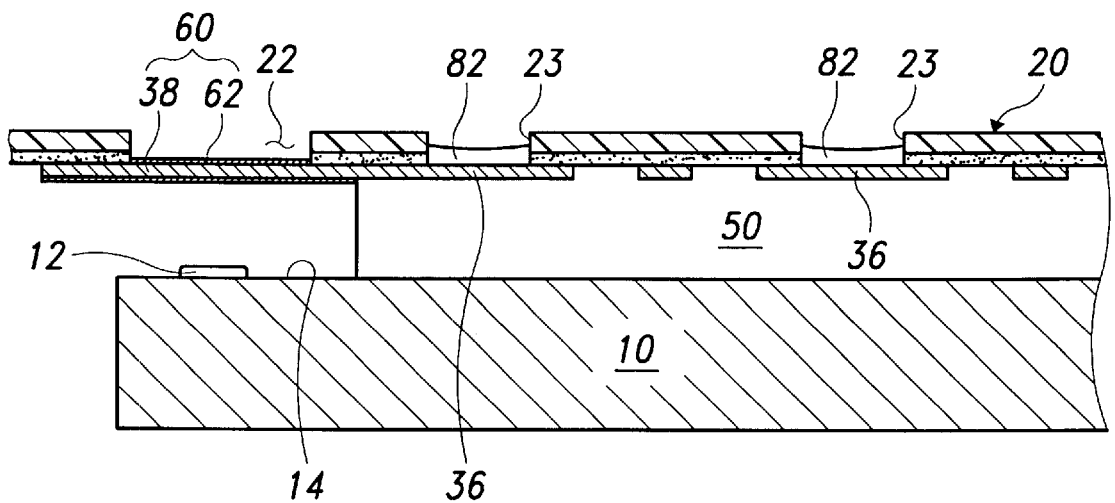
FIG. 8 is a cross-sectional view depicting the semiconductor chip attached to an elastomer chip carrier that is attached to a bottom surface of the wiring board.

Referring to FIG. 8, the active surface 14 of a semiconductor chip 10 is attached to the bottom surface of the elastomer chip carrier 50 such that a peripheral margin of the chip 10 containing electrical bonding pads 12 overhangs the edges of the chip carrier 50 below the window 22 (step 44). Although an adhesive can be used to attach the chip to the carrier 50, it is preferable to heat the elastomer carrier 50 to about 140° C., causing it to become molten, and then pressing the active surface 14 of semiconductor chip 10 to the molten surface and holding it there until the elastomer cools and re-solidifies, thereby bonding the surface 14 of the chip 10 directly to the bottom surface of the elastomer carrier 50.

Figure 9:
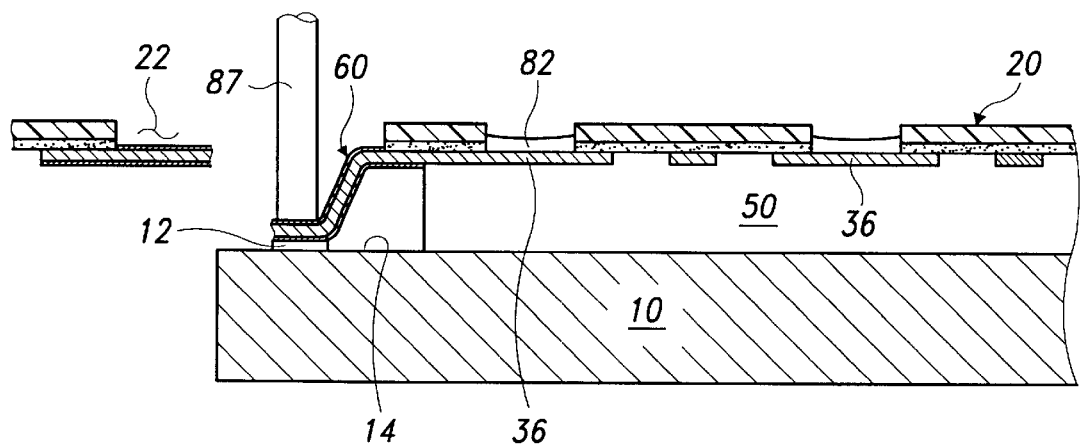
FIG. 9 is a cross-sectional view depicting bonding of the beam leads that are exposed through the window of the wiring board to bonding pads on the semiconductor chip.

Referring to FIG. 9, the semiconductor chip attachment step is followed by a beam lead bonding process that employs a bonding tool 87 to bond the beam leads 60 to the bonding pads 12 of the semiconductor chip 10 through the window 22 (step 45). When the bonding tool 87 presses down on the beam leads 60, the beam leads 60 are easily parted and bonded because of the pairs of opposing stress-raiser notches 38a previously formed into the beam leads 60.

Figure 10:
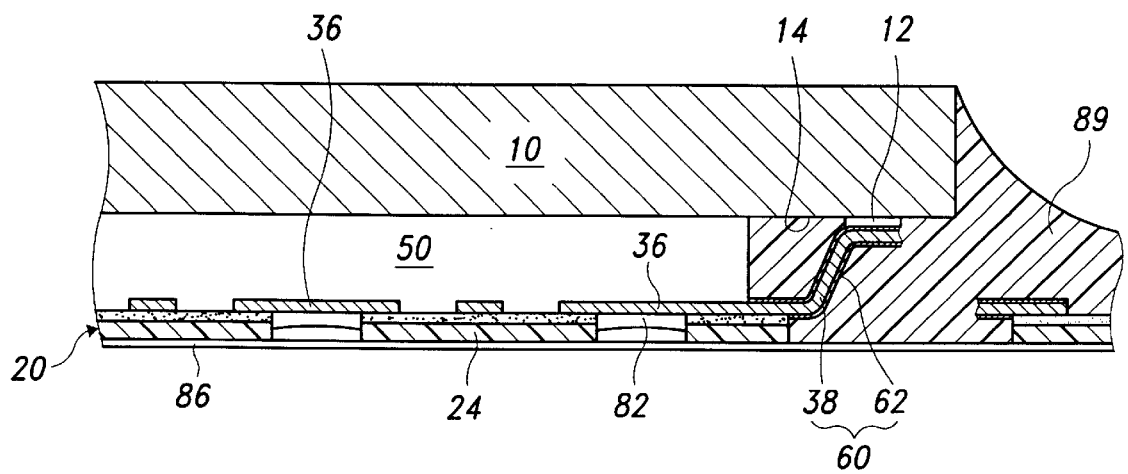
FIG. 10 is a cross-sectional view depicting an encapsulant encapsulating a bonding area between the beam leads and the bonding pads.
Figure 11:
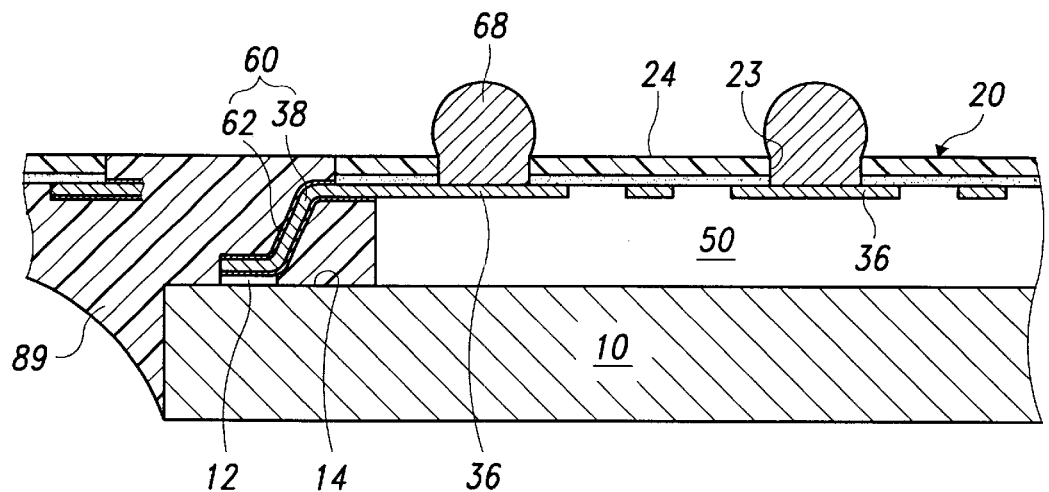
FIG. 11 is a cross-sectional view depicting solder balls attached to the Cu traces exposed through the connection holes of the wiring board.

Referring to FIG. 10, after the beam leads 60 have been bonded to respective bonding pads 12 on the chip 10, the bonding area is encapsulated to protect the active surface 14 of the semiconductor chip 10 and the beam leads 60 from harmful environmental elements (step 46). A dispenser (not shown) dispenses a viscous liquid encapsulant 89 onto the bonding area, and the encapsulant 89 is then cured. Prior to dispensing the encapsulant 89, a cover film 86 is attached to the top surface of the wiring board 20 to prevent any overflow or runoff of the liquid encapsulant 89. After the encapsulant 89 is cured, the cover film 86 is removed.

Figure 1:
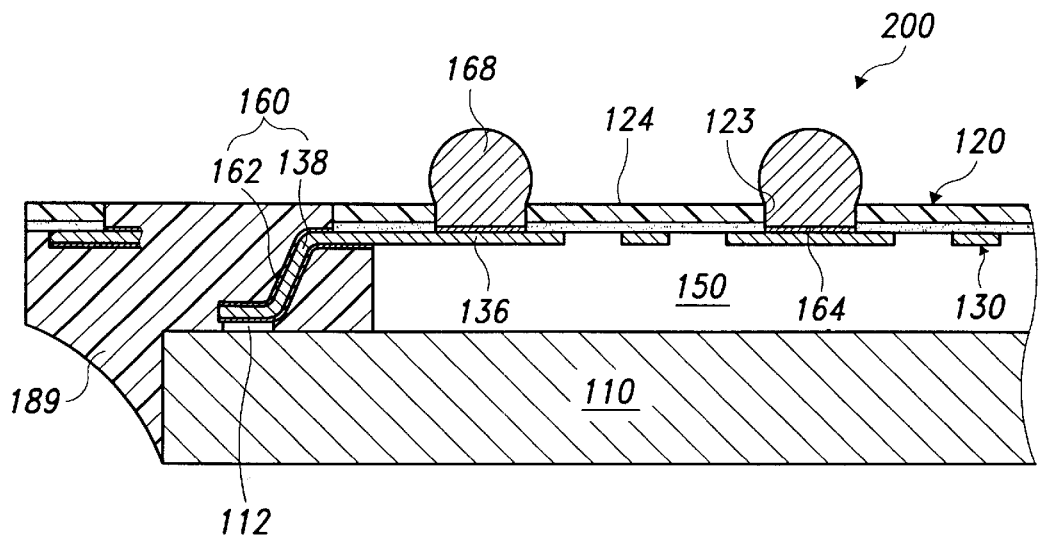
FIG. 1 is a cross-sectional view of a conventional μ-BGA package.
Figure 2:
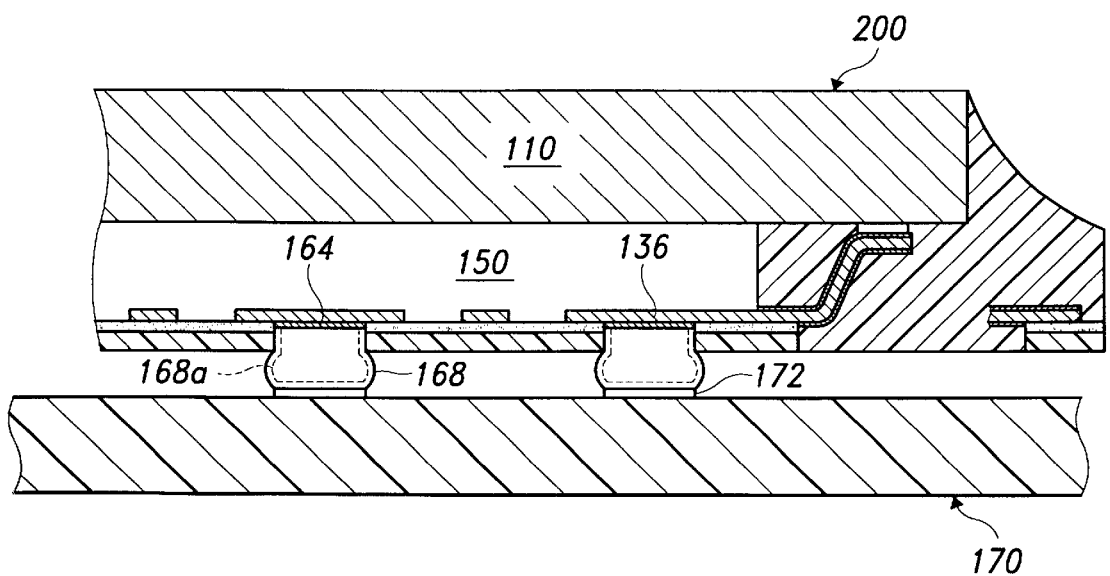
FIG. 2 is a cross-sectional view of the μ-BGA of FIG. 1 mounted on a main board.
Figure 12:
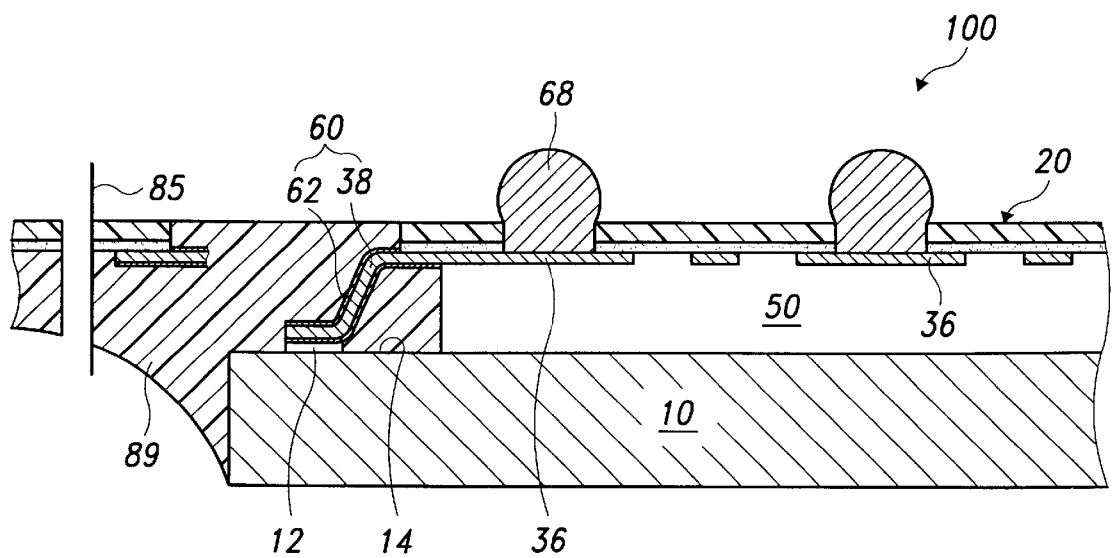
FIG. 12 is a cross-sectional view depicting separation of individual packages from a ganged assembly of packages.

Referring to FIG. 1, after the cover film 86 has been removed, solder balls are attached to the solder ball pads 36 to form solder bumps 68 (step 47). Since the previously applied pre-flux 82 (see FIG. 10) is already in place on the solder ball pads 36, no additional flux is required to attach or form the solder bumps 68. After the solder balls are placed on the pre-flux 82 on the solder ball pads 36, the solder bumps 68 are attached and formed by means of a reflow soldering process, such as an infrared reflow or a laser reflow process. Any remaining pre-flux and other residues remaining on the wiring board 20 are then washed away. Referring to FIG. 12, individual chip scale packages are "singulated," or separated from the multiplicity of simultaneously fabricated packages, by cutting them along a line 85 at their margins.

Those skilled in the art will recognize that, in this embodiment, the solder balls 68 bond directly to the solder ball pads 36 without an intervening Au layer plated onto the pads 36, thereby eliminating the formation of any Au-solder intermetallic compound in the solder bumps 68, and the pre-flux 82 further eliminates any need to apply a flux to the pads 36 before attaching the solder bumps 68 to them.

Figure 13:
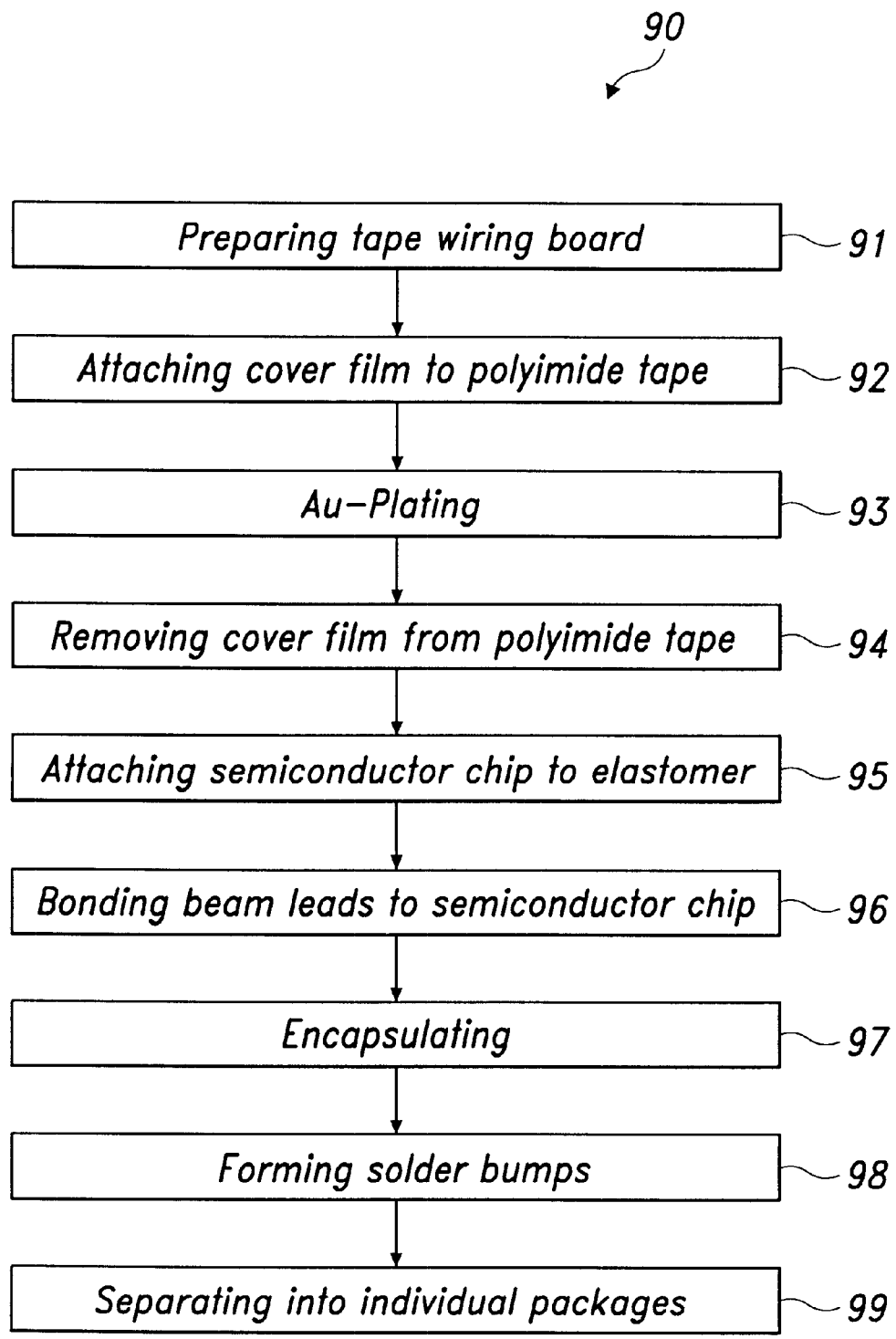
FIG. 13 is a flowchart of another method for manufacturing a chip scale package according to a second embodiment of the present invention.

FIG. 13 is a flowchart of another method 90 for manufacturing a chip scale package according to a second embodiment of the present invention. The second method 90 differs from the first method 40 of FIG. 3 in that the second method 90 employs a temporary cover film over the solder ball pads instead of the pre-flux to prevent the solder ball pads from being plating with Au. Thus, step 91 in FIG. 13 of the second method, preparing the wiring board, is identical to step 41 in FIG. 3 of the first method.

Figure 14:
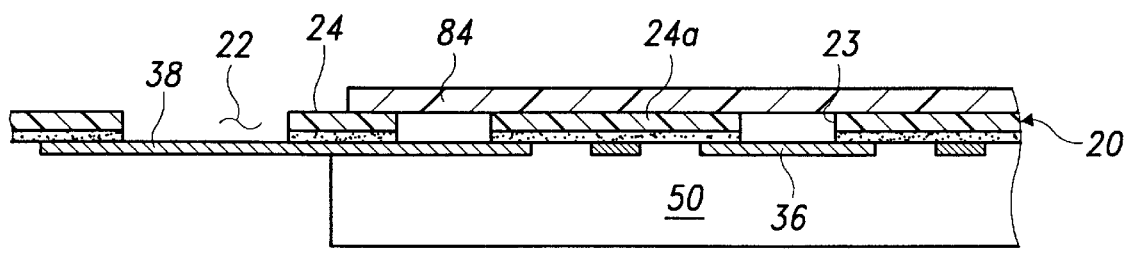
FIG. 14 is a cross-sectional view depicting a cover film attached to a top surface of a tape wiring board; and, FIG. 15 is a cross-sectional view depicting an Au-plating of beam leads with the cover film attached to the top surface of the wiring board.
Figure 15:
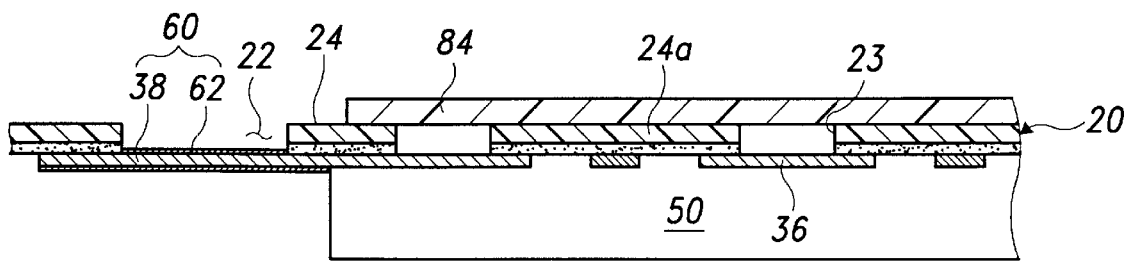

Referring to FIGS. 14 and 15, after preparing the tape wiring board 20, a cover film 84 is attached to the top surface of the inner part 24a to prevent the Au-plating of the solder ball pads 36 (FIG. 13, step 92). Beam leads 60 are defined by plating the outer wiring patterns 38 in the window 22 with Au to about 1 μm thickness (step 93). The cover film 84 is removed after Au plating (step 94). To facilitate film removal, the cover film can be provided with a special adhesive layer. For example, an adhesive tape that is sensitive to ultraviolet light can be used as the cover film 84. Then, simply irradiating the ultraviolet-sensitive tape with an ultraviolet light causes the adhesive on the tape to release its adhesion and the tape is then easily removed.

Attaching the semiconductor chip to the wiring board (step 95), bonding the beam leads to the bonding pads on the semiconductor chip (step 96), and encapsulating the chip-beam lead bonding area (step 97) are all the same as in steps 44, 45 and 46 of the first embodiment shown in FIG. 3, respectively.

The solder bumps are formed and attached (step 98) in a manner similar to that described above in connection with the first embodiment. However, because no pre-flux, as described above with reference to FIG. 3, was applied to the solder ball pads before Au plating, it is preferable to apply a conventional soldering flux, e.g., by a screen printing process, to the solder ball pads before the solder balls are reflow soldered to them. As with the first embodiment, any remaining flux and other residues on the wiring board are washed away. As a final step (FIG. 13, step 99), the strip of multiple wiring boards is separated into individual packages in a cutting process.

The present invention may have many variations and/or modifications of the inventive components. For example, cover film removal (step 94) of FIG. 13 can take place after encapsulation (step 97).

Importantly, both embodiments of the invention prevent Au-plating of the solder ball pads, and thereby improve the bonding quality and solderability between the solder balls and the solder ball pads of a main board by eliminating the formation of the Au-solder intermetallic compound.

Although particular embodiments of the present invention have been described in detail above, it should be clearly understood that many variations and/or modifications of the basic inventive concepts taught herein that may occur to those skilled in the art will still fall within the spirit and scope of the present invention, as defined in the appended claims.

What is claimed is:

1. A method for manufacturing a chip scale package, the method comprising:

(A) preparing a tape wiring board comprising a strip of polyimide tape having a plurality of copper traces on a bottom surface of the tape, a window through the tape having portions of the copper traces extending across the window, and a plurality of connection holes through the tape exposing other portions of the copper traces through the holes;

(B) applying a preflux to the portions of the copper traces exposed through the connection holes;

(C) plating the copper traces extending across the window with gold (Au), wherein the preflux prevents the portions of the copper traces exposed through the connection holes from being plated;

(D) forming a solder bump on each of the portions of the copper traces exposed through the connection holes, such that each solder bump bonds through the preflux to the portions of the copper traces exposed through the connection holes without an intervening gold layer, whereby the formation of gold-solder intermetallic compound at the portions of the copper traces exposed through the connection holes is prevented.

2. A method for manufacturing a chip scale package, the method comprising:

(A) preparing a tape wiring board comprising a strip of polyimide tape having a plurality of copper traces on a bottom surface of the tape, a window through the tape having portions of the copper traces extending across the window, a plurality of connection holes through the tape exposing other portions of the copper traces through the holes, and an elastomer chip carrier on a bottom surface of the tape;

(B) applying a preflux to the portions of the copper traces exposed through the connection holes;

(C) plating the copper traces extending across the window with gold (Au) to define beam leads, wherein the preflux prevents the portions of the copper traces exposed through the connection holes from being plated;

(D) attaching a semiconductor chip to the elastomer beam carrier;

(E) bonding the gold plated beam leads to the semiconductor chip through the window;

(F) encapsulating the bonding area between the beam leads and the semiconductor chip; and, (G) forming a solder bump on each of the portions of the copper traces exposed through the connection holes, such that the solder bump bonds through the preflux to the portions of the copper traces exposed through the connection holes without an intervening gold layer, whereby the formation of gold-solder intermetallic compound at the portions of the copper traces exposed through the connection holes is prevented.

3. The method of claim 2, wherein attaching the semiconductor chip to the elastomer chip carrier comprises melting a bottom surface of the carrier and contacting a surface of the chip to the melted elastomer.

4. The method of claim 3, wherein attaching the semiconductor chip to the elastomer chip carrier comprises attaching an active surface of the chip having connection pads on a periphery thereof to the chip carrier such that the periphery overhangs the chip carrier and is exposed below the window in the tape.

5. The method of claim 2, wherein encapsulating the bonding area between the beam leads and the semiconductor chip comprises dispensing a viscous liquid encapsulant onto the area of the bonded parts.

6. The method of claim 2, wherein forming the solder bumps further comprises:

(G1) placing solder balls on the respective portions of the Cu traces that are exposed through the connection holes, each such portion having the pre flux solution thereon;

(G2) reflow soldering the solder balls so that each solder ball is bonded to a respective copper trace portion exposed through a connection hole and forms a solder bump thereon; and, (G3) washing off any remaining pre flux and other impurity residues around the solder bumps.

7. The method of claim 6, wherein the reflow soldering process comprises an infrared reflow method.

8. A method for manufacturing a chip-scale package, comprising:

(A) preparing a tape wiring board comprising a polyimide tape having copper traces on a bottom surface of the tape, a window through the tape having portions of the copper traces extending across the window, a plurality of connection holes in the tape exposing other portions of the copper traces, and an elastomer chip carrier on the bottom surface of the tape;

(B) attaching to the top surface of the polyimide tape a cover film comprising an adhesive layer, wherein the layer of adhesive on the cover film is an ultraviolet-light-sensitive adhesive that releases its adhesion upon exposure to ultraviolet light;

(C) plating the portions of the copper traces extending across the window with gold (Au) to define beam leads;

(D) removing the cover film from the polyimide tape by irradiating the cover film with an ultraviolet light;

(E) attaching the semiconductor chip to the elastomer;

(F) bonding the beam leads to the semiconductor chip;

(G) encapsulating the bonding area between the beam leads and the semiconductor chip; and, (H) forming a solder bump on each of the solder ball mounting pads.

9. The method of claim 8, wherein the semiconductor chip is directly attached to the elastomer chip carrier by heating a bottom surface of the elastomer chip carrier until the elastomer reaches a molten state, contacting a surface of the chip to the molten elastomer, and cooling the molten elastomer until it solidifies.

10. The method of claim 9, wherein attaching the semiconductor chip to the elastomer chip carrier comprises attaching an active surface of the chip having electrical connection pads around periphery thereof to the bottom surface of the chip carrier such that the periphery of the chip overhangs the chip carrier and is exposed below the window in the tape.

11. The method of claim 8, wherein encapsulating the bonding area between the beam leads and the semiconductor chip comprises dispensing a viscous liquid encapsulant onto the area of the bonded parts.

12. The method of claim 8, wherein forming a solder bump on the solder ball mounting pads comprises:

(H1) applying a flux to the solder ball mounting pads;

(H2) placing solder balls on the flux;

(H3) reflow soldering the solder balls so that the solder balls bond to the respective solder ball mounting pads and form solder bumps thereon; and, (H4) washing off any remaining flux and other impurity residues around the solder bumps.

13. The method of claim 12, wherein the reflow soldering comprises an infrared reflow method.

14. The method of claim 8, wherein the cover film is attached to the top surface of the polyimide tape such that it does not cover the window.

* * * * *